(12) United States Patent
Tang

(10) Patent No.: US 6,887,633 B2
(45) Date of Patent: May 3, 2005

(54) RESOLUTION ENHANCING TECHNOLOGY USING PHASE ASSIGNMENT BRIDGES

(76) Inventor: Chih-Hsien Nail Tang, Room 1603, 16F, No. 333, Sec. 1, Keelung Road, Taipei (TW), 110

(*) Notice: Subject to any disclaimer, the term of this patent is extended or adjusted under 35 U.S.C. 154(b) by 30 days.

(21) Appl. No.: 10/071,858

(22) Filed: Feb. 8, 2002

(65) Prior Publication Data

US 2003/0152843 A1 Aug. 14, 2003

(51) Int. Cl.$^7$ .............................................. G09F 9/00
(52) U.S. Cl. ............................. 430/30; 430/5; 430/22; 716/19; 716/20; 716/21
(58) Field of Search ................... 430/5, 30; 716/19–21

(56) References Cited

U.S. PATENT DOCUMENTS

2003/0018948 A1 * 1/2003 Chang et al. ................. 716/8

\* cited by examiner

Primary Examiner—Mark F. Huff
Assistant Examiner—Kripa Sagar
(74) Attorney, Agent, or Firm—Christensen O'Connor Johnson Kindness PLLC

(57) ABSTRACT

In one embodiment, a spacing is determined for each edge of a number of features in a photolithographic design. The edges have at least a partially predictable layout. Based on the spacing and the predictable layout, a bridge structure is generated. Each bridge of the bridge structure connects one of the edges to an edge of a neighboring feature. Then, the features and the bridge structure are provided for a phase assignment. The phase assignment assigns features at opposite ends of each bridge in the bridge structure to opposite phases. In another embodiment, a sub-resolution assist feature (SRAF) is introduced for an edge of a feature and a bridge is generated from the feature to the SRAF. Then, the feature and the SRAF are assigned to opposite phases based on the relationship defined by the bridge.

18 Claims, 11 Drawing Sheets

FIG. 2

RESOLUTION ENHANCING TECHNOLOGY USING PHASE ASSIGNMENT BRIDGES

FIELD OF THE INVENTION

The present invention pertains to the field of Resolution Enhancing Technologies (RET) in photolithography. More particularly, this invention relates to generating bridges between features and using the bridges to assign the features to particular phases.

BACKGROUND OF THE INVENTION

In photolithography, a design is transferred onto a surface by shining a light through a mask of the design onto a photosensitive material covering the surface. The light exposes the photo-sensitive material in the pattern of the mask. A chemical process etches away either the exposed material or the unexposed material, depending on the particular process that is being used. Another chemical process etches into the surface wherever the photosensitive material was removed. The result is the design itself, either imprinted into the surface where the surface has been etched away, or protruding slightly from the surface as a result of the surrounding material having been etched away.

Photolithography is used for a variety of purposes, such as manufacturing micro-mechanical devices and integrated circuits (ICs). For ICs, a silicon wafer goes through several iterations of imprinting a design on the wafer, growing a new layer over the previously imprinted design, and imprinting another design on the new layer. The different designs on each layer interact electrically to form circuit components, such as transistors, transmission paths, and input/output pads. Typical IC layers include a diffusion layer, an active layer, a metal layer, a polygon layer, and one or more contact layers to electrically connect features on neighboring layers.

Photolithography can make very small components. Hugh numbers of small circuit components can fit within a given surface area. Current photolithography techniques routinely fit millions of circuit components onto a single chip. Market pressures, however, continually drive for smaller components, higher density, and greater functionality.

As the smallest feature dimension (the critical dimension) in a design nears or drops below the wavelength of the light source used to project the design, the image no longer identically represents the shapes of the features in the design's mask. For instance, the ends of lines are cut off, sharp corners are rounded, and features become increasingly interdependent, causing features "bleed" into each other or not resolve at all. An area of study called resolution enhancing technology (RET) is constantly in development to compensate for these effects in near- or sub-wavelength photolithographic processes.

Examples of RETs include sub-resolution assist features (SRAFs) and phase shift masks (PSM). SRAFs, also called scattering bars or simply assist features, take advantage of the fact that densely packed edges actually resolve more sharply than isolated edges when dealing with near- and sub-wavelength feature dimensions. In which case, an SRAF is a feature that is added to a mask near an existing feature to improve the resolution of the existing feature as if the existing feature where in a densely packed area. SRAFs, however, are so narrow that they do not appear in the imaged design—hence the name "sub-resolution."

PSM takes advantage of the interference characteristics of light. Light that is polarized in one direction (0° phase or phase I) does not interfere with light polarized in the perpendicular, or opposite, direction (180° phase or phase II). In which case, adjacent features can be assigned, or polarized, to opposite phases in a phase mask to reduce their interdependence. PSM is also a double-exposure technique. A second mask is used in a second exposure of the same surface to "trim" very detailed features. In some implementations, features assigned to different phases are separated into separate masks for the double exposure.

PSM phase assignment can provide excellent results in particularly troublesome areas. PSM, however, is not usually applied to large areas or entire design layers because, in the complex areas where PSM is usually needed, it is often very difficult to assign phases. For instance, features can be very complex polygons. They can loop back on themselves, or a number of them can be interwoven so that two polygons are adjacent in one area but are separated by one or more other polygons in another area. In either case, no matter what phase assignment is chosen, certain portions of polygons are likely to be adjacent to portions of polygons assigned to the same phase. In these complex situations, there usually is no clear, predictable approach to phase assignment, making PSM difficult, time consuming, and costly to apply.

BRIEF DESCRIPTION OF THE DRAWINGS

Examples of the present invention are illustrated in the accompanying drawings. The accompanying drawings, however, do not limit the scope of the present invention. Similar references in the drawings indicate similar elements.

DETAILED DESCRIPTION

Figure 1A:
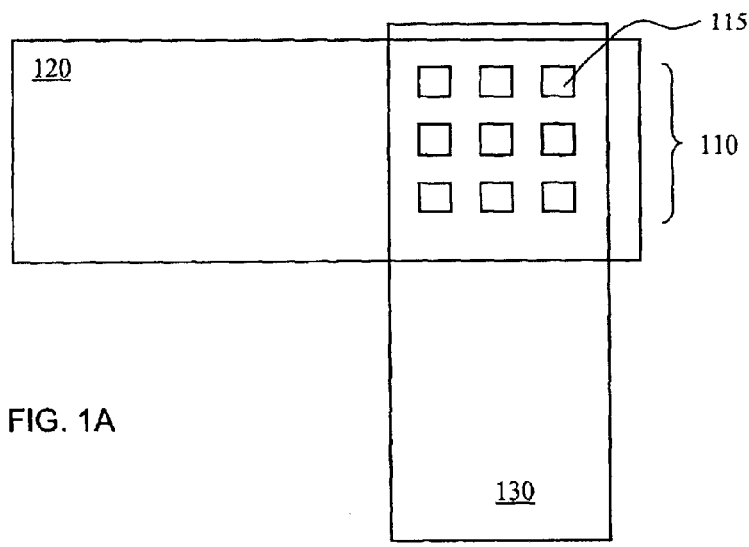
FIGS. 1A, 1B, and 1C illustrate an intended contact array and possible resulting images of the contact array.

In the following detailed description, numerous specific details are set forth in order to provide a thorough understanding of the present invention. However, those skilled in the art will understand that the present invention may be practiced without these specific details, that the present invention is not limited to the depicted embodiments, and that the present invention may be practiced in a variety of alternate embodiments. In other instances, well known methods, procedures, components, and circuits have not been described in detail.

Parts of the description will be presented using terminology commonly employed by those skilled in the art to convey the substance of their work to others skilled in the art. Also, parts of the description will be presented in terms of operations performed through the execution of programming instructions. As well understood by those skilled in the art, these operations often take the form of electrical, magnetic, or optical signals capable of being stored, transferred, combined, and otherwise manipulated through, for instance, electrical components.

Various operations will be described as multiple discrete steps performed in turn in a manner that is helpful for understanding the present invention. However, the order of description should not be construed as to imply that these operations are necessarily performed in the order they are presented, nor even order dependent. Lastly, repeated usage of the phrase "in one embodiment" does not necessarily refer to the same embodiment, although it may.

The present invention is a resolution enhancing technology (RET) that defines relationships between neighboring photolithographic features so that the neighboring, or adjacent, features can be assigned to opposite phases. In one embodiment, the present invention enables efficient and cost effective phase-shift technology applied to an entire layer of an integrated circuit (IC) design. As discussed in more detail below, the present invention temporarily introduces "bridges" in a data structure representing a mask. The bridges connect neighboring features that are expected to resolve better if they are assigned to opposite phases. The relationships defined by the bridges can then be used to assign features at opposite ends of each bridge to opposite phase polarizations.

One embodiment of the present invention is particularly suited to improving the resolution of contacts in contact layers of ICs. Contacts are often arranged in arrays having patterns that are predictable, at least to a certain extent. The present invention takes advantage of the predictability of these contact arrays to define phase relationships among the contacts. Other embodiments of the present invention can similarly improve the resolution of a variety of features having predictable shapes as well as arrays of features having predictable patterns.

In one embodiment, the present invention introduces sub-resolution assist features, or scattering bars, prior to introducing the phase-assignment bridges. The scattering bars are connected with bridges to the previously existing features so that the scattering bars and the corresponding features are assigned to opposite phases. In other words, this embodiment of the present invention combines the two separate technologies of scattering bars and phase assignment. Assigning a phase to a scattering bar may seem counterintuitive at first since a phase assignment is intended to improve resolution and scattering bars are not supposed to resolve. In fact, however, assigning a scattering bar to a phase opposite that of the feature being assisted by the scattering bar improves the sharpness of the assisted feature more so than if the scattering bar where not assigned to a different phase, and the scattering bar remains a sub-resolution feature.

FIG. 1A illustrates one embodiment of a contact array 110 comprising nine contacts 115. Contact array 110 electrically connects a polygon layer 120 to a metal layer 130. The contact array 110 is designed to provide a particular resistance between the polygon layer 120 and the metal layer 130. In alternate embodiments, a contact array can be used to connect any of a variety of layers, not just a polygon layer to a metal layer.

Figure 1B:
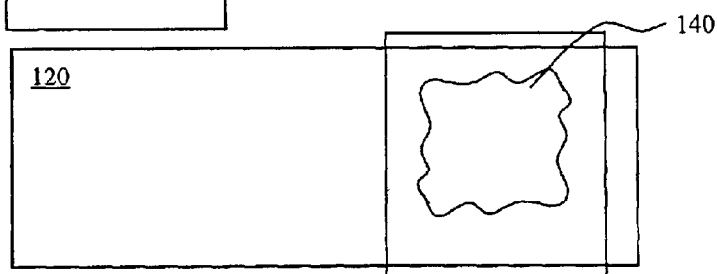

If the dimensions of each contact 115 and/or the spacing between contacts 115 are near or below the wavelength of the light source used to image the contact array, contact array 110 may distort when imaged. For instance, if contacts 115 are small compared to the wavelength and the spacing between the contacts is small compared to the wavelength, the contacts will print larger than intended. For instance, as shown in FIG. 1B, the image could be a blob 140. In which case, the resistance of blob 140 may be too low.

Figure 1C:
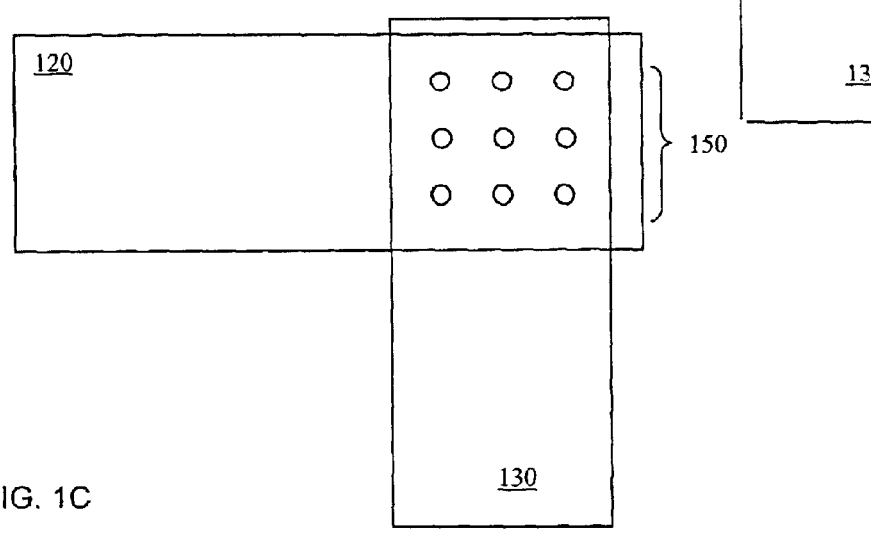

Conversely, if contacts 115 are again small compared to the wavelength but the spacing between the contacts is large, the contacts will print smaller than intended. For instance, as shown in FIG. 1C, each contact may only partially resolve into array 150. In which case, the resistance of array 150 may be too high. It is possible that the contacts could fail completely to resolve, resulting in an open circuit between polygon layer 120 and metal layer 130.

In all three of these situations, phase assignment and possibly sub-resolution assist features could improve the resolution of the contact array. Contacts 115 could be manually assigned phases so that the closest neighbors to each contact has a different phase. A contact layer in a real chip, however, may include thousands of contact arrays. The arrays may have a variety of contact patterns and densities. In which case, manually assigning phases for so many contacts would be impractical.

Contact arrays tend to be at least partially predictable. For instance, contacts within a particular contact layer are usually of uniform shape and size. The present invention takes advantage of this predictability to define relationships among contacts on a global scale so that large numbers of contacts can be efficiently assigned to phases.

Figure 2:
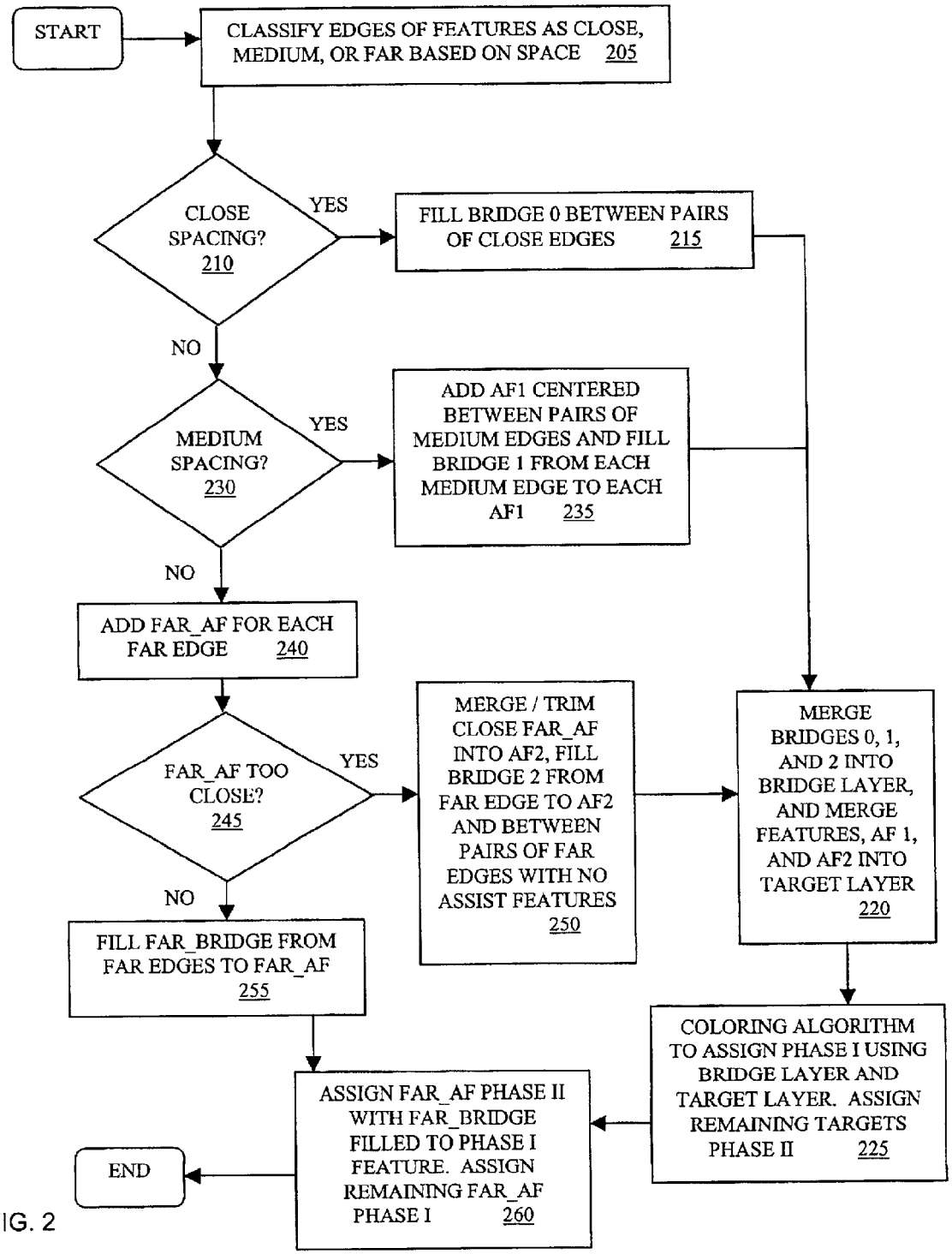
FIG. 2 demonstrates a flow for one embodiment of the present invention.

FIG. 2 demonstrates the flow of one embodiment of the present invention. In general, the present invention generates bridges between closest neighbors. Features at opposite ends of each bridge are assigned to different phases. The illustrated embodiment includes a number of implementation specific details. Not all of the functions illustrated in FIG. 2 are needed in every embodiment. Some embodiments may combine one or more of the illustrated functions, perform the functions in a different order, and/or include additional functions.

Applying the flow of FIG. 2 to contact array 110 of FIG. 1A, all of the edges of the contacts are first classified in block 205 based on the spacing separating the edges from neighboring edges. The goal is to locate the closest adjacent neighbors. In the illustrated embodiment, the edges are classified as close, medium, or far edges. This can be done in any number of ways.

For instance, GDSII is a common data format used to represent design layouts. In GDSII, each polygon (contacts 115 in this case) is represented by a set of vertices in an x-y plane. Since each contact 115 is a square, each contact is represented by four x-y vertices. Each edge, then, is represented by two x-y vertices. To determine the spacing for an edge, the edge can be projected perpendicularly away from its polygon until an x-y coordinate is encountered that is occupied by another polygon.

If an occupied coordinate is not found within a predefined maximum spacing, the maximum spacing is used. The maximum spacing may depend on a number of factors and can be user defined. For instance, the interdependence between contact arrays is likely to be very small compared to the interdependence between contacts within an array because contact arrays are likely to be separated by a comparatively large distance. Therefore, the maximum spacing may be set somewhere between the maximum predicted spacing between edges within an array and the minimum predicted spacing between arrays.

A perpendicular projection is likely to be adequate because perpendicular neighbors are predicted to be closer than diagonal neighbors in contact pattern 110.

In block 210, all of the close edges are filtered out. The definition of a close edge is an edge with an existing neighbor that is close enough not to need an assist feature. Recall that densely packed edges resolve more sharply than isolated edges for near- or sub-wavelength features. If two edges are sufficiently close, they help each other resolve more sharply, and an assist feature is not needed. The actual distance for close spacing in a given layout is usually based on previously conducted models of similar layouts. Since a close edge is by definition close to a neighboring edge, close edges always come in pairs.

In block 215, the space between each pair of close edges is filled to form a bridge, BRIDGE 0. Filling in a bridge can be performed in any number of ways. For instance, in GDSII format, each edge in a pair of close edges can perpendicularly project out to the opposite edge in the pair. Then, the vertices of the intersections of the projected edges form the bridge. Or, if a pair of close edges are aligned, the sets of vertices for each pair of close edges can just be taken directly to form a bridge.

In block 230, the medium edges are filtered out. The definition of a medium edge is an edge separated from its neighbor such that an assist feature can be placed between them. Again, the actual distance for medium spacing can be determined in any number of ways, and is usually based on previous models. As with close edges, medium edges always come in pairs.

In block 235, an assist feature, AF1, is added in the middle of each pair of medium edges. Assist features can be formed in any number of ways. In GDSII, they are usually formed by perpendicularly projecting an edge out to two particular distances and taking the vertices from each projected position. For a pair of medium edges in this embodiment, the distances to which an edge is projected are calculated to place the assist feature in the center of the distance separating the pair of edges. Once the assist feature is added, the two spaces between each pair of medium edges and the centered assist feature are filled with two bridges, BRIDGE 1.

In block 240, assist features, far_AF, are added for each far edge. Again, the definition of far and the position of far_AF assist features are usually based on previous models of similar systems.

In block 245, the far_AF assist features are filtered to determine if any of them are too close to other features. Assist features usually are not allowed to overlap. If they overlap, their combined size may be large enough for part of the assist features to resolve. So, to test closeness in GDSII, for example, each assist feature could be tested to see if it occupies any coordinates that are also occupied by another feature.

Furthermore, features need to be separated by at least a minimum amount of space to prevent the features from bleeding into one another. The minimum spacing requirement is usually dependent upon the technology process being used. To test closeness around far_AF assist features, perpendicular projections of individual edges will usually not be sufficient because features can be too close in a diagonal direction as well as perpendicular. Therefore, one approach would be to have the far_AF assist features grow proportionately in all four directions out to the minimum spacing requirement to see if any occupied coordinates are encountered.

Far_AF assist features that overlap or are too close are handled in block 250. Assist features can be merged into larger features if the combined features will not resolve. Most of the time, though, assist features are resized, or trimmed down, to achieve the minimum spacing. Assist features can only be trimmed to a certain extent, however, because features have a minimum size requirement. The minimum size requirement, like the minimum spacing requirement, is usually dependent upon the technology process being used. In one embodiment, if a trimmed assist feature drops below the minimum size requirement, the feature is just deleted. Any number of rule-based approaches can be used to implement these manipulations, and prioritize which features are manipulated and how.

Testing for closeness is only done for far_AF assist features because close and medium edge spacings are predicted to not have closeness problems. That is, close and medium edge spacings define edges within a contact array. Since arrays are predictable to a certain extent, defining the relationships among internal edges is simplified. Far edges, however, are defined to be isolated edges around the perimeter of a contact array. If a contact array is not rectangular or square, far_AF assist features may be too close. A examples of this situation are illustrated and discussed below with respect FIGS. 4A and 4B.

Referring again to block 250, any features that get merged and/or resized are re-labeled type AF2. Bridges, BRIDGE 2, are formed between the far edges and any remaining AF2 assist features. In one embodiment, where two far_AF assist features were too close and only one assist feature remains, only one far edge will receive a bridge. If two far_AF features were too close and neither of them remains, the far edges are probably diagonally close, and a bridge is formed between the diagonal edges.

At this point, bridges have been formed for close edges, BRIDGE 0, medium edges, BRIDGE 1, and far edges that had assist features that were too close, BRIDGE 2. Assist features have been formed between medium edges, AF1, assist features have been formed for far edges, far_AF, and assist features have been formed from far edges that were too close to other features, AF2.

In block 220, in order to accommodate the phase assignment algorithm described below, BRIDGE 0 bridges, BRIDGE 1 bridges, and BRIDGE 2 bridges are all merged into a single bridge layer. That is, all the vertices from the three types of bridges are accumulated into a data structure. The bridge layer is merely a temporary design artifact. It does not represent any actual features that will be added to a mask of the design.

Furthermore, to accommodate the phase assignment algorithm, the contacts and the assist features AF1 and AF2 are all merged into a single target layer. That is, all the vertices from the three types of features are accumulated into a separate data structure. The target layer actually represents physical features that will be added to a mask of the design. The assist features are too small to resolve when the mask is illuminated, but they are still actually part of the mask design.

In block 225, a "coloring" algorithm is used to assign phases to each of the target features in the target layer. Any number of phase assignment algorithms can be used. Other embodiments may not need to separate target and bridge layers, and may instead distinguish between features and bridges in any number of other ways. In the illustrated embodiment however, the algorithm operates on the target features in the target layer and uses the bridge layer to recognize the relationships defined by the bridges among the target features. The illustrated algorithm defines two states—unpolarized features that pass incoherent light and polarized features that pass phase I light. So, the algorithm assigns opposite states to features at opposite ends of each bridge. Then, any feature not assigned phase I by the coloring algorithm is assigned phase II in block 225.

At this point, the only features that remain to be assigned a phase are the far_AF assist features. In block 255, bridges, labeled type Far_BRIDGE, are filled from the far edges to the remaining far_AF features. In block 260, any far_AF feature that connects to a contact assigned to phase I is assigned to phase II. And, all other far_AF features are assigned to phase I.

Since all of the bridges were filled from the contact edges out to assist features, contacts are practically guaranteed to be assigned a phase opposite that of any corresponding assist features. There is a possibility, however, that adjacent assist features corresponding to different contacts will be assigned to the same phase since there are no bridges that extend from assist feature to assist feature. In other words, the contacts are given higher priority in the phase assignment scheme due to the fact that bridges are filled from contacts to assist features. Other embodiments could give higher priority to assist features by filling bridges from assist features rather than from contacts, although it may be impractical to do so since the goal is to improve the resolution of the contacts.

Depending on what is known about the characteristics of an array of features, alternate embodiments may be implemented in a variety of different ways. For instance, rather than classifying edges into one of three classes, an alternate embodiment may recognize four or more classes. The additional class(es) could include a second intermediate spacing where, for instance, two assist features are inserted. Alternately, the far class could insert two or more assist features rather than one.

Another embodiment may only include two edge classes, such as close and far, close and medium, or medium and far. Assuming assist features are not needed for a particular array of features, edges could be classified as close or far, where bridges are only filled for close edges and far edges are ignored.

Figure 3:
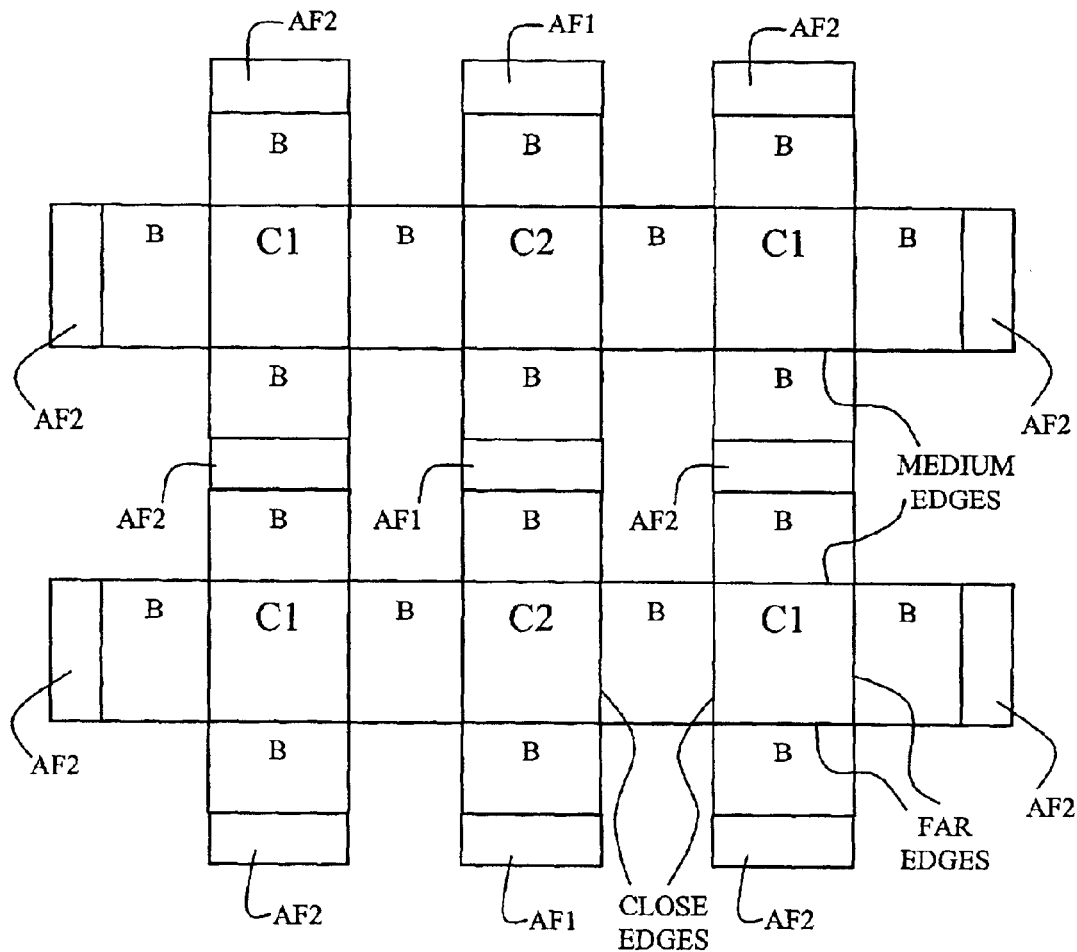
FIGS. 3 through 5D illustrate examples of feature arrays to which the present invention is applied.

FIGS. 3 through 5D illustrate various embodiments of the present invention applied to a number of feature patterns. In FIG. 3, six contacts, each labeled with a "C", are arranged in a rectangular pattern having two horizontal rows and three vertical columns. The two horizontal rows are farther apart than the three vertical columns. A phase assignment has been applied using three edge classes just as in the flow described in FIG. 2. Each contact has four edges. Edges around the perimeter of the pattern are obviously classified as far edges since no features are anywhere in the vicinity of the pattern. Edges between vertical columns are classified as close edges. And, edges between horizontal rows are classified as medium edges.

Going through the steps of FIG. 2, bridges, each labeled B, are filled directly between each pair of close edges. Assist features, each labeled AF, are inserted in the center between each pair of medium edges, and two bridges, B, are filled from each pair of medium edges to the centered assist feature. Each far edges also gets an assist feature, AF, and, since no assist features for far edges are too close to any other feature, a bridge is simply filled from each far edge to each corresponding assist feature. Then, features at opposite ends of bridges are assigned opposite phases, marked as either "1" or "2" in the figure. Going around the circle of closest neighbors for each contact, it is easy to see that each neighbor has an opposite phase.

Figure 4A:
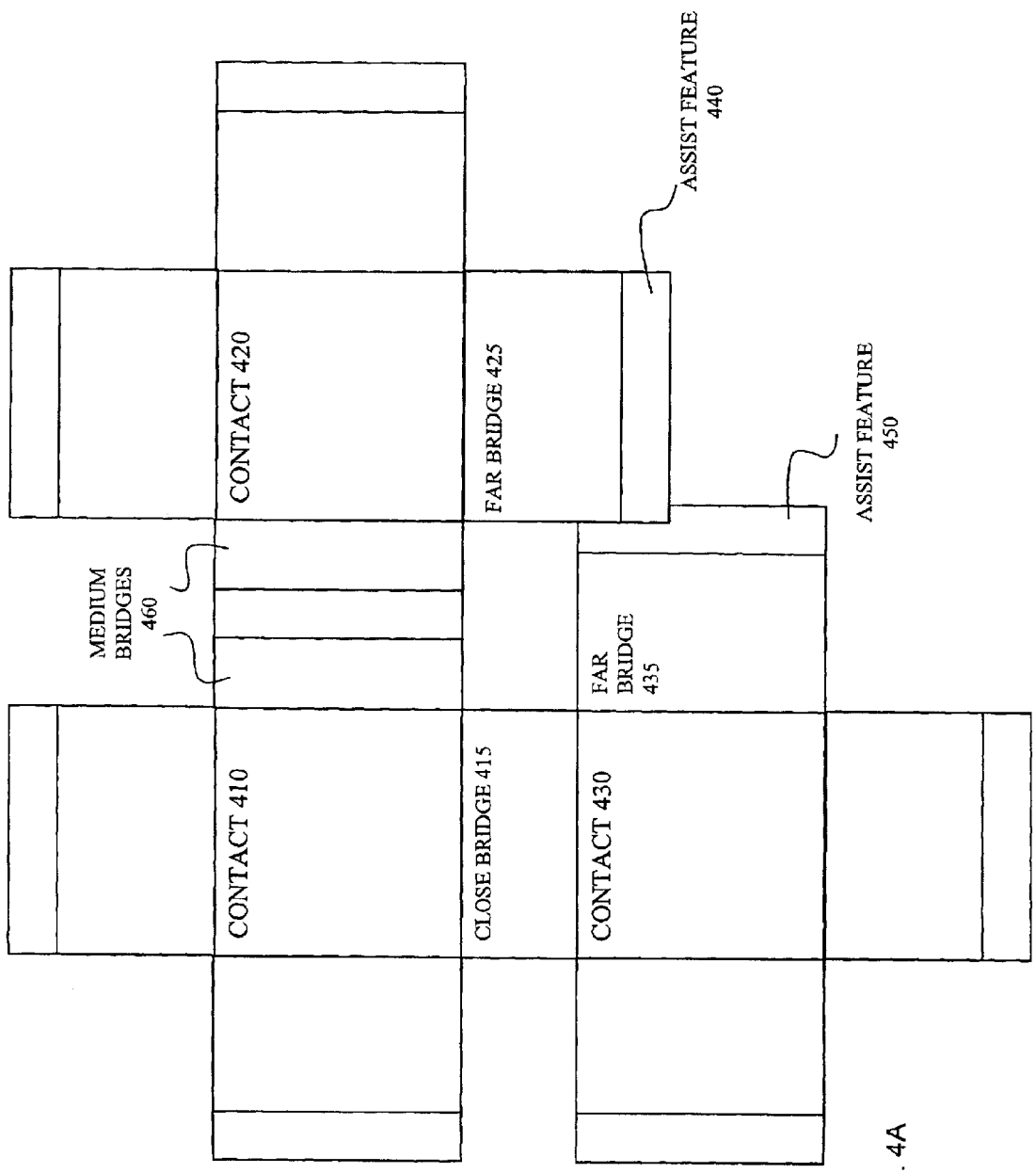

FIG. 4A illustrates another set of contacts, 410, 420, and 430, that are in the middle of a phase assignment similar to that of FIG. 2. Contacts 410 and 430 have a pair of close edges, so a close bridge 415 fills in the space between them. Contacts 410 and 420 have a pair of medium edges, so a pair of medium bridges 460 and an assist feature fill in the space between them. All the other edges are classified as far and have far assist features. Note that two of the far assist features, 440 and 450, are too close. In fact, they overlap, forming a side-ways, lopsided "T." Left unchanged, the intersection of the overlapping assist features could allow enough light through to resolve, introducing an unwanted feature in the design. Moreover, the shape of the overlapping assist features may violate certain manufacturing constraints. That is, the dimensions of the short arm of assist feature 450 extending above feature 445 may be too small to create in a mask.

Figure 4B:
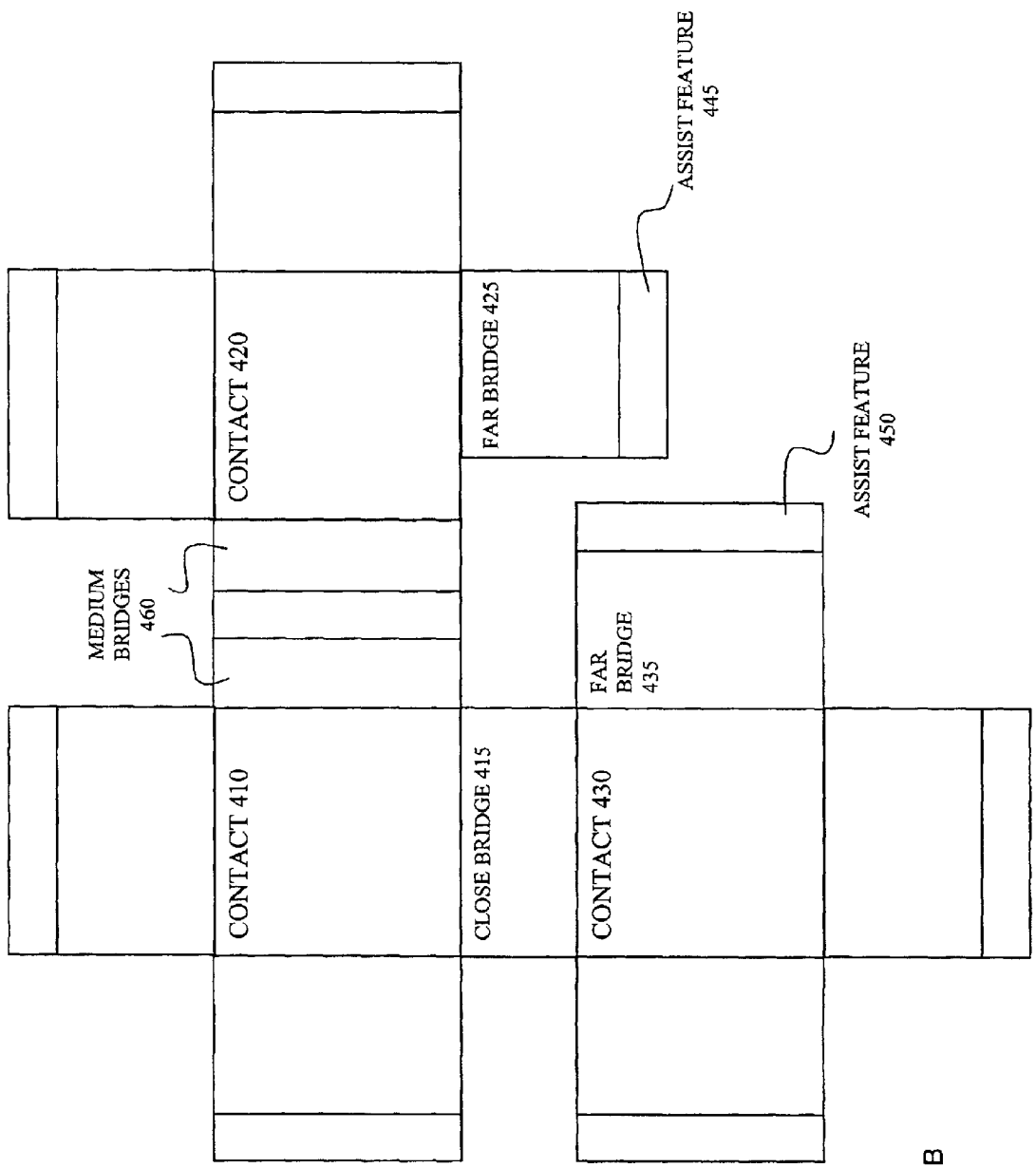

FIG. 4B illustrates one solution. Assist feature 445 was trimmed back to provide at least a minimum separation between it and feature 450. If the size of assist feature 445 after trimming had been smaller than a minimum allowable size, the feature would have been deleted entirely. Once the bridges are defined, phase assignment can proceed as usual.

Figure 5A:
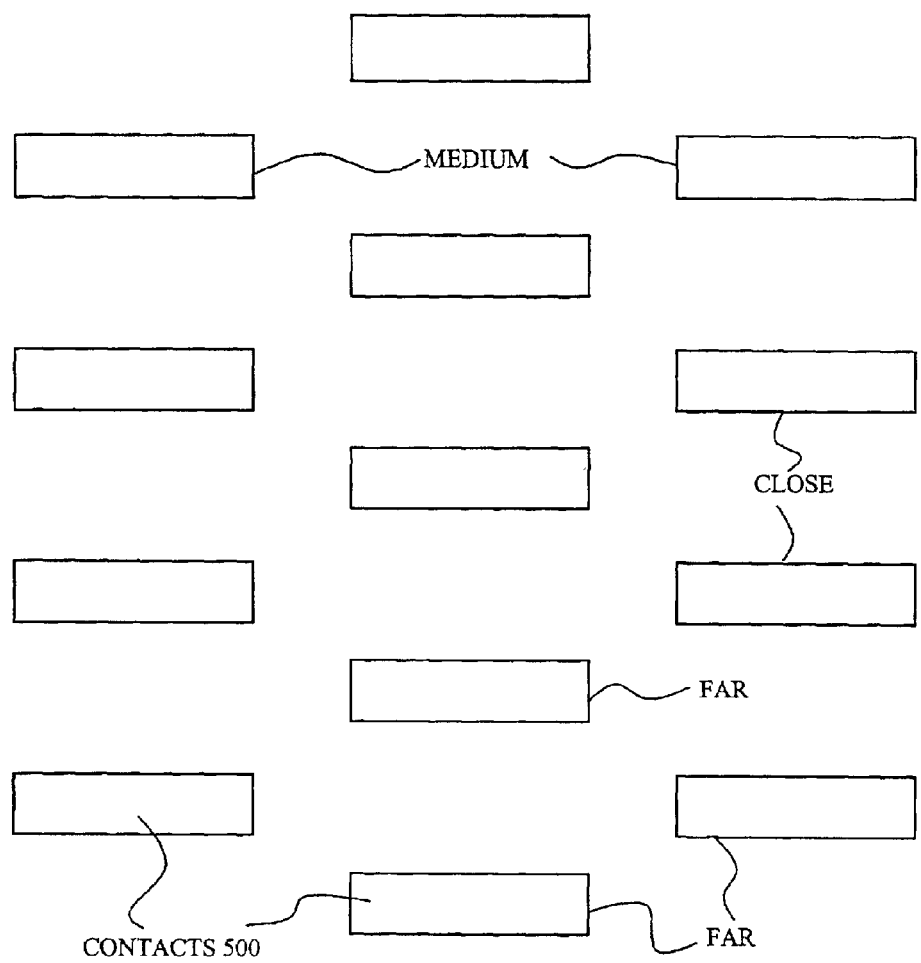

FIG. 5A illustrates another common feature array pattern. The contacts 500 are rectangular rather than square. This type of array is common, for instance, in the contact layer forming dynamic random access memory (DRAM) cells. A phase assignment approach similar to that described in FIG. 2 could be used with this array pattern as well.

For instance, with three edge classes (close, medium, and far) all of the edges along the perimeter of the pattern are obviously far edges. The vertical edges of the contacts in the middle of the pattern that face out are also far edges because perpendicular projections of those vertical edges do not run into any neighboring features. Assuming that the horizontal spacing between contacts is defined to be close, all of the horizontal internal edges are close edges. And, assuming that the perpendicular vertical spacing between contacts is defined to be medium, all of the inward facing vertical edges are medium edges. Examples of close, medium, and far edges are noted in FIG. 5A.

The pattern comprises staggered columns of contacts such that a contact's closest neighbors are in neighboring columns. That is, the space separating corners of contacts from one column to the next is closer than the space separating contacts within a column. Therefore, the treatment given to each edge class is different for the type of contact pattern shown in FIG. 5A than for the type of contact pattern addressed in FIG. 2.

Figure 5B:
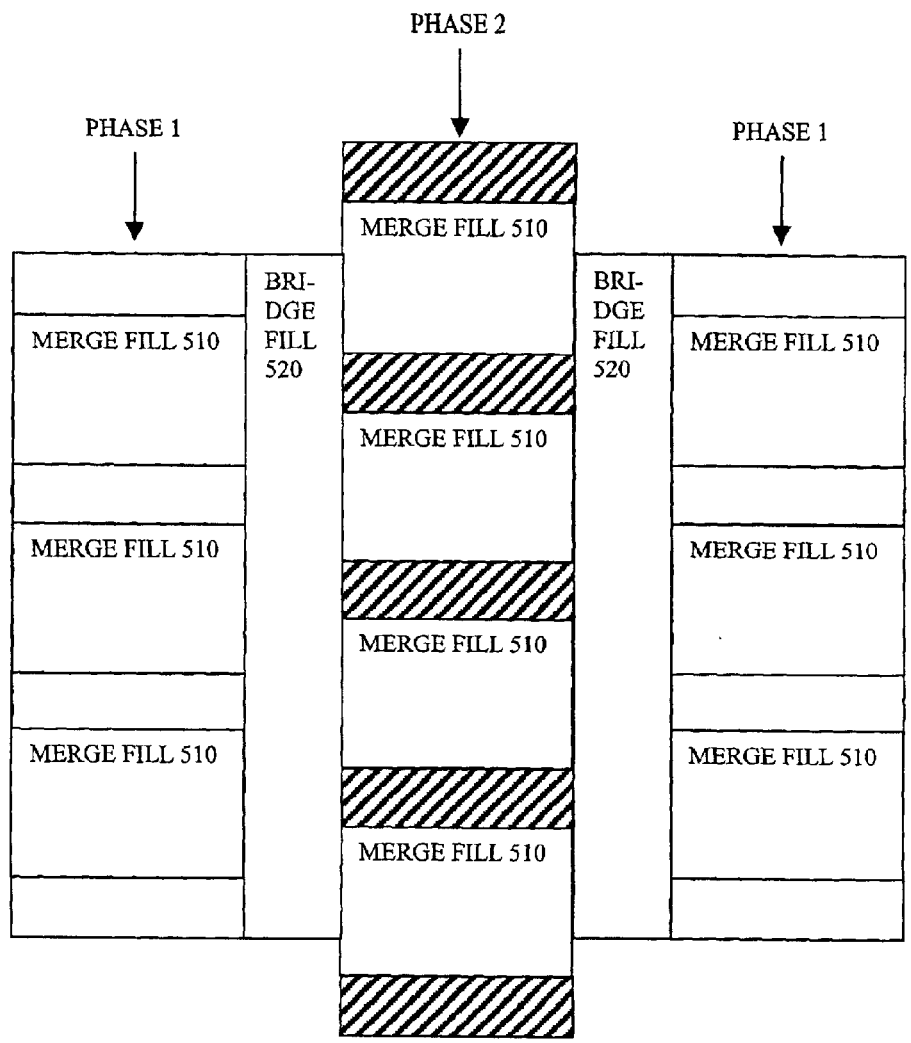

As shown in FIG. 5B, if the close edges are too close to add assist features, bridges 510 are filled between pairs of close edges, not for phase assignment purposes, but instead to "merge" the contacts into strips. That is, before growing phase assignment bridges, the spaces separating contacts in each vertical column are filled with bridges 510.

Then, the vertical strips are treated as individual target features. Each strip has four edges. In one embodiment, the original medium and far edge classifications are also merged such that an edge of a strip containing coordinates of a medium contact edge is classified a medium edge, and an edge of a strip containing coordinates of a far contact edge is classified a far edge. In another embodiment, edges of strips are reclassified after the strips are formed using, for instance, two classes—close and far. In either case, phase assignment bridges 520 are extended between pairs of edges between the strips.

Using the phase assignment algorithm from FIG. 2, the strips are provided to the phase assignment algorithm in a target layer and bridges 520 are provided in a bridge layer. In this case, both the target layer and the bridge layer are merely temporary design artifacts. Neither layer describes features that will actually appear in the mask for the design. As shown in FIG. 5B, opposite phases are assigned to strips at opposite ends of bridges 520—phase I for the outer strips and phase II for the center strip. Then, contacts that were merged into a particular strip in the target layer are assigned the same phase as the respective strip. In the illustrated embodiment, contacts assigned to phase II are cross-hatched. The other contacts are phase I. Once the phases have been assigned, it is easy to see that the circle of closest neighbors to each contact are assigned opposite phases. A similar approach could be used for staggered horizontal rows, as well as for square contacts.

Figure 5C:
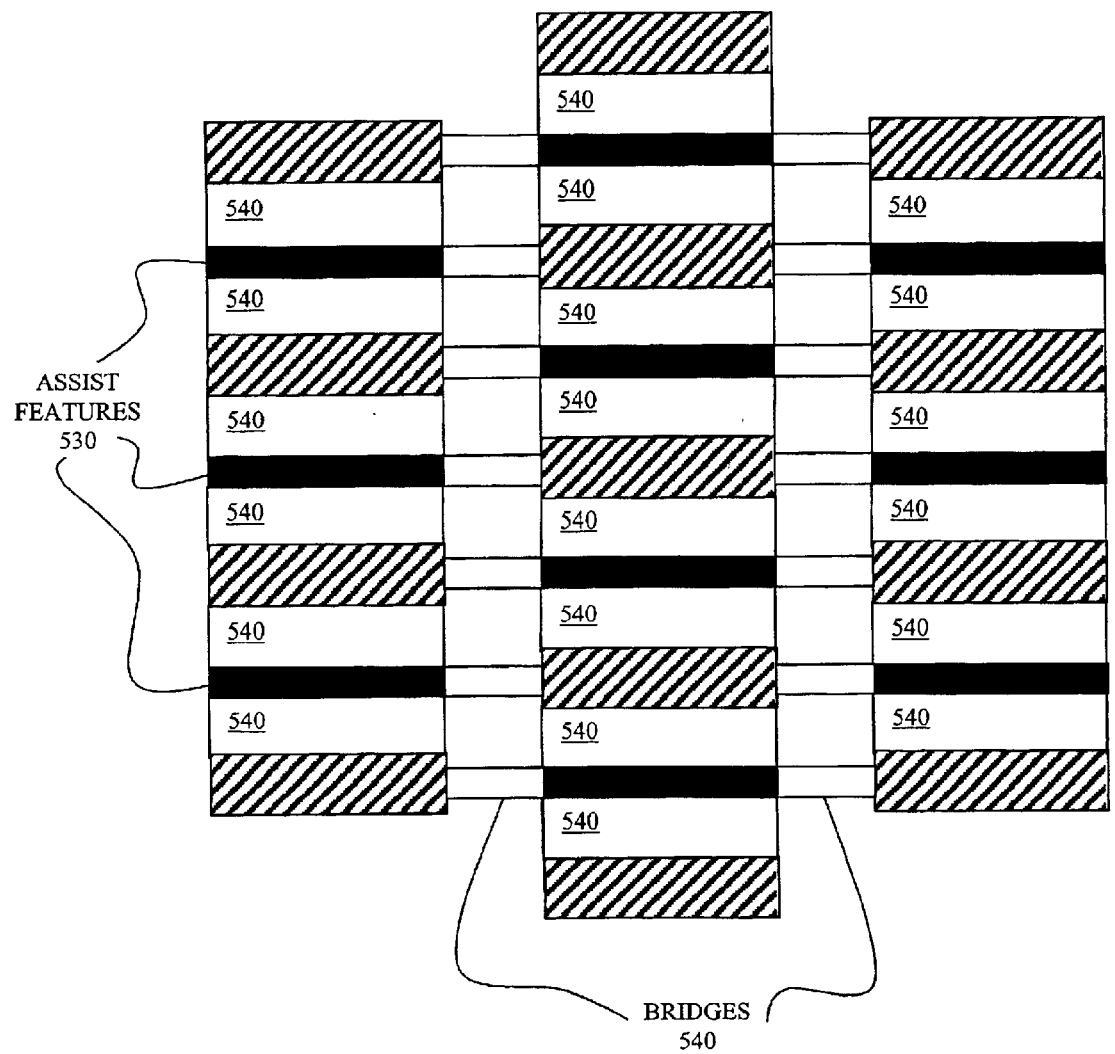

As shown in FIG. 5C, if the close edges are far enough apart to add assist features, assist features 530 (shown in solid black) are centered between pairs of close edges. In the illustrated embodiment, far edges and medium edges do not receive assist features. Then, phase assignment bridges 540 can be filled out from each close edge and each medium edge. Once opposite phases have been assigned to features at opposite ends of bridges, every contact will be assigned to the same phase (as shown by the cross-hatching) and every assist feature will be assigned to the opposite phase.

Figure 5D:
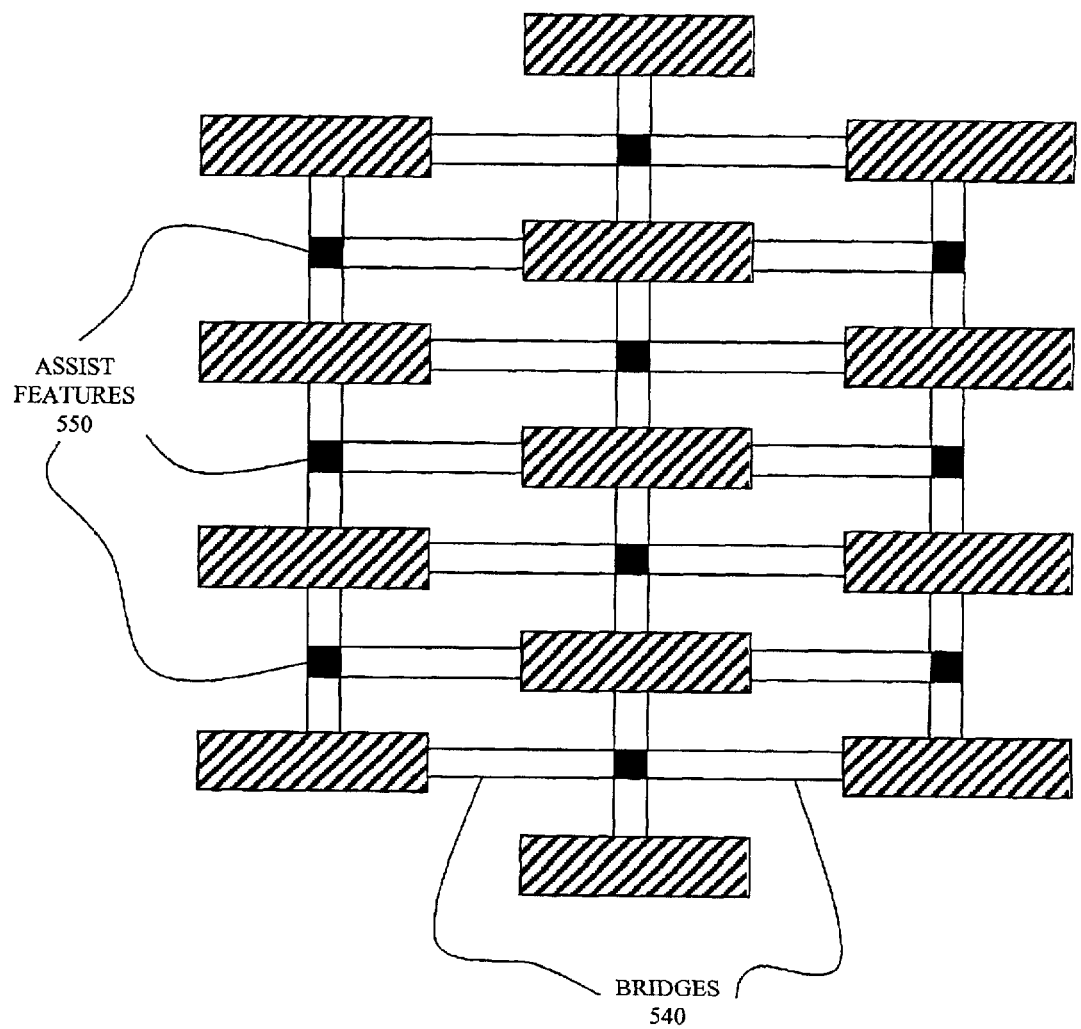

In FIG. 5D, the rectangular assist features 530 from FIG. 5C have been resized down to square assist features 550. Square assist features can be used anywhere that rectangular assist features are used as long as the square assist features sufficiently improve the resolution of the edges being assisted. For instance, it may be acceptable to use square assist features for the arrays described in FIGS. 3, 4A, and 4B. Any number of approaches can be used to resize assist features. In one embodiment, both ends of a rectangular assist feature are trimmed an equal amount.

As demonstrated by the above examples, edge classes and rules for treating each edge class can be developed for a wide variety of predictable feature shapes and feature patterns. A variety of criteria in addition to spacing can also be used to classify edges. For instance, rather than, or in addition to, classifying edges as close, medium, and far in FIG. 5A, edges could be classified as vertical and horizontal, or as long and short. In either case, bridges could be extended out from every horizontal edge, or every long edge, to merge vertical columns of contacts into strips. Then, phase-assignment bridges could be extended from every vertical edge of a strip, or every edge of a strip containing a short edge.

Figure 6:
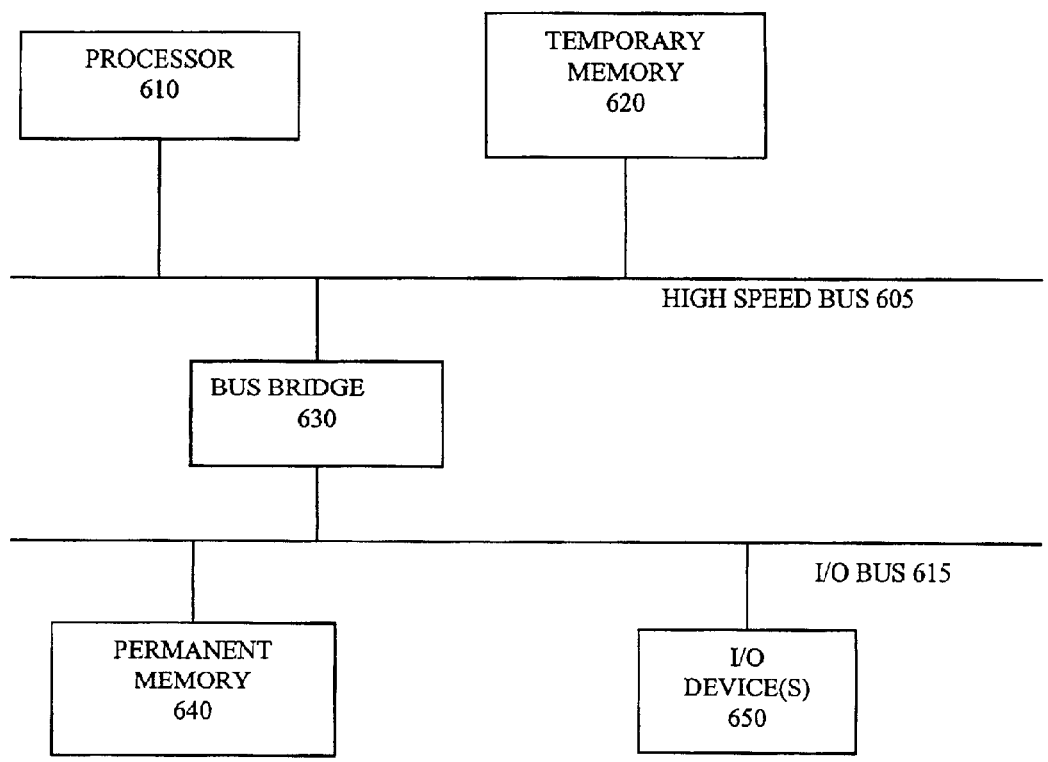
FIG. 6 illustrates one embodiment of a hardware system to implement the present invention.

FIG. 6 illustrates one embodiment of a hardware system intended to represent a broad category of computer systems such as personal computers, workstations, and/or embedded systems. In the illustrated embodiment, the hardware system includes processor 610 coupled to high speed bus 605, which is coupled to input/output (I/O) bus 615 through bus bridge 630. Temporary memory 620 is coupled to bus 605. Permanent memory 640 is coupled to bus 615. I/O device(s) 650 is also coupled to bus 615. I/O device(s) 650 may include a display device, a keyboard, one or more external network interfaces, etc.

Certain embodiments may include additional components, may not require all of the above components, or may combine one or more components. For instance, temporary memory 620 may be on-chip with processor 610. Alternately, permanent memory 640 may be eliminated and temporary memory 620 may be replaced with an electrically erasable programmable read only memory (EEPROM), wherein software routines are executed in place from the EEPROM. Some implementations may employ a single bus, to which all of the components are coupled, or one or more additional buses and bus bridges to which various additional components can be coupled. Those skilled in the art will be familiar with a variety of alternate internal networks including, for instance, an internal network based on a high speed system bus with a memory controller hub and an I/O controller hub. Additional components may include additional processors, a CD ROM drive, additional memories, and other peripheral components known in the art.

In one embodiment, the present invention, as described above, is implemented using one or more hardware systems such as the hardware system of FIG. 6. Where more than one computer is used, the systems can be coupled to communicate over an external network, such as a local area network (LAN), an internet protocol (IP) network, etc. In one embodiment, the present invention is implemented as software routines executed by one or more execution units within the computer(s). For a given computer, the software routines can be stored on a storage device, such as permanent memory 640.

Figure 7:
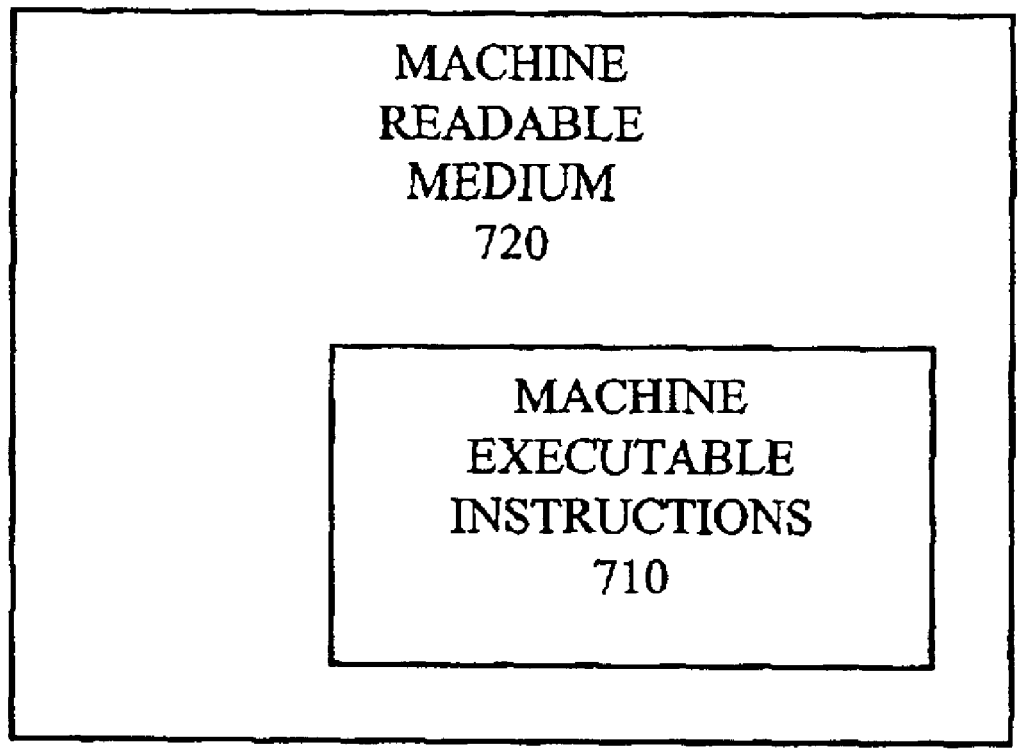
FIG. 7 illustrates one embodiment of a machine-readable medium to store executable instructions to implement the present invention.

Alternately, as shown in FIG. 7, the software routines can be machine executable instructions 710 stored using any machine readable storage medium 720, such as a diskette, CD-ROM, magnetic tape, digital video or versatile disk (DVD), laser disk, ROM, Flash memory, etc. The series of instructions need not be stored locally, and could be received from a remote storage device, such as a server on a network, a CD ROM device, a floppy disk, etc., through, for instance, I/O device(s) 650 of FIG. 6.

From whatever source, the instructions may be copied from the storage device into temporary memory 620 and then accessed and executed by processor 610. In one implementation, these software routines are written in the C programming language. It is to be appreciated, however, that these routines may be implemented in any of a wide variety of programming languages.

In alternate embodiments, the present invention is implemented in discrete hardware or firmware. For example, one or more application specific integrated circuits (ASICs) could be programmed with one or more of the above described functions of the present invention. In another example, one or more functions of the present invention could be implemented in one or more ASICs on additional circuit boards and the circuit boards could be inserted into the computer(s) described above. In another example, field programmable gate arrays (FPGAs) or static programmable gate arrays (SPGA) could be used to implement one or more functions of the present invention. In yet another example, a combination of hardware and software could be used to implement one or more functions of the present invention.

Thus, phase assignment using bridges is described. Whereas many alterations and modifications of the present invention will be comprehended by a person skilled in the art after having read the foregoing description, it is to be understood that the particular embodiments shown and described by way of illustration are in no way intended to be considered limiting. Therefore, references to details of particular embodiments are not intended to limit the scope of the claims.

What is claimed is:

1. A method comprising:
   determining a spacing for each of a plurality of edges comprising one or more features in a photolithographic design, said plurality of edges having at least a partially predictable layout;
   defining a bridge structure for the plurality of edges based on the spacings and the predictable layout, each bridge of the bridge structure logically connecting one of the plurality of edges to an edge of a neighboring feature but does not form a feature in the photolithographic design; and
   providing the features and the bridge structure for a phase assignment, said phase assignment to assign features at opposite ends of each of said bridges to opposite phases.

2. The method of claim 1 wherein the bridge structure is defined by:
   categorizing at least one pair of the plurality of edges as near edges; and
   filling a space between each pair of near edges by defining a bridge that logically connects each pair of near edges.

3. The method of claim 1 wherein the bridge structure is defined by:
   categorizing at least one pair of the plurality of edges as medium edges;
   inserting a sub-resolution assist feature (SRAF) between each pair of medium edges; and
   filling a space between each medium edge and its corresponding SRAF by defining a bridge that logically connects the medium edge and its corresponding SRAF.

4. The method of claim 1 wherein the bridge structure is defined by:
   categorizing a set of the plurality of edges as far edges;
   inserting a sub-resolution assist feature (SRAF) for each far edge; and
   filling a space extending from one or more of the set of far edges by defining a bridge that logically connects the far edge and its SRAF.

5. The method of claim 4 wherein filling the space comprises:
   identifying any of the SRAFs that are within a minimum separation distance from another feature;

increasing a separation distance to at least the minimum separation distance for any identified SRAFs by resizing, merging, and/or deleting the identified SRAFs as needed;

defining a bridge that logically connects any far edge and its corresponding SRAF where the corresponding SRAF still exists or was merged; and defining a bridge that logically connects any pair of far edges for which both corresponding SRAFs were deleted.

6. The method of claim 1 wherein the bridge structure is defined by:

introducing a sub-resolution assist feature (SRAF) for one of the plurality of edges having a particular spacing; and logically connecting one of the bridges of the bridge structure between the edge having the particular spacing and the SRAF.

7. The method of claim 6 further comprising:

introducing a sub-resolution assist feature and defining a bridge for a plurality of additional edges having the particular spacing.

8. The method of claim 6 further comprising:

introducing sub-resolution assist features and defining bridges for a plurality of additional edges having a second particular spacing.

9. The method of claim 6 wherein the features are assigned a phase by:

merging the plurality of features and any SRAFs to a target layer for the phase assignment; and analyzing the bridge structures in a data layer to assign opposite phases to each feature at the ends of the bridge.

10. The method of claim 1 wherein the photolithographic design comprises a mask design for a contact layer of an integrated circuit design.

11. The method of claim 1 wherein the one or more features comprise one of a square feature, an array of square features, a rectangular feature, and an array of rectangular features.

12. The method of claim 1 wherein determining the spacing comprises:

measuring each of the spacings as a projection perpendicular from each of the plurality of edges to a neighboring edge or to a maximum projection distance.

13. The method of claim 1 wherein the one or more features comprise staggered sets of features having a shorter spacing between neighboring features in neighboring staggered sets than between neighboring features within each set, and wherein generating the bridge structure comprises:

merging each said staggered set into a strip feature; and defining bridges that logically connect neighboring strip features.

14. The method of claim 1 wherein the spacing for each of the plurality of edges comprises at least one of a perpendicular distance from a given edge, a length of a given edge, a horizontal orientation of a given edge, and a vertical orientation of a given edge.

15. A method comprising:

introducing a sub-resolution assist feature (SRAF) for an edge of a feature in a photolithographic design;

generating a bridge from the feature to the SRAF, said bridge defining a relationship between the feature and the SRAF; and providing the feature, the SRAF, and the bridge for a phase assignment, said phase assignment to assign the feature and the SRAF to opposite phases based on the relationship defined by the bridge.

16. The method of claim 15 wherein the SRAF comprises a square SRAF.

17. The method of claim 15 wherein the SRAF comprises a rectangular SRAF, the method further comprising:

resizing the rectangular SRAF into a square SRAF.

18. The method of claim 17 wherein resizing the rectangular SRAF comprises:

trimming both ends of the rectangular SRAF an equal amount.

* * * * *